(12) United States Patent  
Tan et al.

(10) Patent No.: US 7,560,199 B2  
(45) Date of Patent: Jul. 14, 2009

(54) POLARIZING PHOTOLITHOGRAPHY SYSTEM

(75) Inventors: Sia Kim Tan, Singapore (SG); Qunying Lin, Singapore (SG); Gek Soon Chua, Singapore (SG); Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 698 days.

(21) Appl. No.: 11/163,481

(22) Filed: Oct. 20, 2005

(65) Prior Publication Data

US 2007/0092839 A1 Apr. 26, 2007

(51) Int. Cl.
G03F 1/00 (2006.01)
(52) U.S. Cl. .......................................... 430/5
(58) Field of Classification Search .............. 430/5; 716/19, 20, 21
See application file for complete search history.

(56) References Cited

U.S. PATENT DOCUMENTS

| | | | |
|---|---|---|---|
| 6,553,562 B2 | 4/2003 | Capodieci et al. | |
| 6,645,678 B2 * | 11/2003 | Wang et al. | 430/5 |
| 6,781,670 B2 | 8/2004 | Krautschik | |
| 6,809,794 B1 | 10/2004 | Sewell | |
| 6,844,206 B1 | 1/2005 | Phan et al. | |
| 6,866,968 B2 | 3/2005 | Shin et al. | |
| 6,871,337 B2 | 3/2005 | Socha | |
| 6,897,942 B2 | 5/2005 | Shiraishi | |
| 6,915,505 B2 | 7/2005 | Hsu et al. | |

OTHER PUBLICATIONS

Estroff et al., "Mask induced polarization", Optical Microlithography XVII, Proceedings of SPIE, 2004, pp. 1069-1080, vol. 5377.
Lin, "Immersion lithography and its impact on semiconductor manufacturing", Optical Microlithography XVII, Proceedings of SPEI, 2004, pp. 46-67, vol. 5377.
Smith et al., "Benefiting from polarization—effects on high-NA imaging", Optical Microlithography XVII, Proceedings of SPEI, 2004, pp. 68-79, vol. 5377.

* cited by examiner

Primary Examiner—Stephen Rosasco
(74) Attorney, Agent, or Firm—Mikio Ishimaru (57) ABSTRACT

A polarizing photolithography reticle system is provided including providing a reticle substrate, forming polarization structures on the reticle substrate, and etching circuit patterns on the reticle substrate on a side opposite the polarization structures.

20 Claims, 11 Drawing Sheets

POLARIZING PHOTOLITHOGRAPHY SYSTEM

TECHNICAL FIELD

The present invention relates to the field of photolithography, and more specifically polarizing photolithography systems.

BACKGROUND ART

Modern consumer electronics, such as cellular phones, digital cameras, and music players, are packing more integrated circuits into an ever shrinking physical space with the expectations for decreasing cost. Numerous technologies have been developed to meet these requirements. One cornerstone for consumer electronics to continue proliferation into everyday life is the on-going size reduction of the integrated circuits.

The integrated circuit development and manufacturing communities must balance developing new technologies while controlling cost. The decreasing size of the integrated circuits presents a myriad of challenges with existing tools and equipments pushed beyond their limits. Numerous new approaches attempt to support the integrated circuit size reduction but require enormous capital investment for unproven new equipments thereby increasing cost.

One proven way control and reduce cost is to use as much existing equipments and tools for the new technology nodes. Other challenges exist with leveraging existing tools and equipments. Most notably, the integrated circuit size may only be reduced slightly and not offering longevity to aggressively shrink the integrated circuits.

One promising technology offers a partial solution for amortizing existing investments while providing sufficient longevity to shrink the integrated circuits. This technology uses water and is called immersion lithography. While immersion lithography conquers some challenges, other challenges remain. One such challenge is a high or extreme numerical aperture in immersion lithography. The size of integrated circuits is so small that the light used to transfer patterns from a stencil, or photolithography reticle, to the wafer behaves differently. In order to use existing light source in a lithography system or control incremental investment for a light source, other solutions are required.

Thus, a need still remains for a photolithography reticle that leverages existing manufacturing techniques while providing integrated circuits size features to meet the new market demands. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a polarizing photolithography reticle system providing a reticle substrate, forming polarization structures on the reticle substrate, and etching circuit patterns on the reticle substrate on a side opposite the polarization structures.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. The same numbers are used in all the drawing FIGs. to relate to the same elements. Also, where multiple embodiments are disclosed and described having some features in common, for clarity and ease of illustration, description, and comprehension thereof, similar and like features one to another will ordinarily be described with like reference numerals.

The term "horizontal" as used herein is defined as parallel elements on the surface of the reticle. The term "vertical" refers to a direction perpendicular to the horizontal as just defined on the same plane or a parallel plane. Terms, such as "on", "above", "below", "bottom", "top", "side" (as in "sidewall"), "higher", "lower", "upper", "over", and "under", are defined with respect to the horizontal plane. The term "on" indicates direct contact between elements.

The term "processing" as used herein includes deposition of material or photoresist, patterning, exposure, development, etching, cleaning, and/or removal of the material or photoresist as required in forming a described structure.

Figure 1:
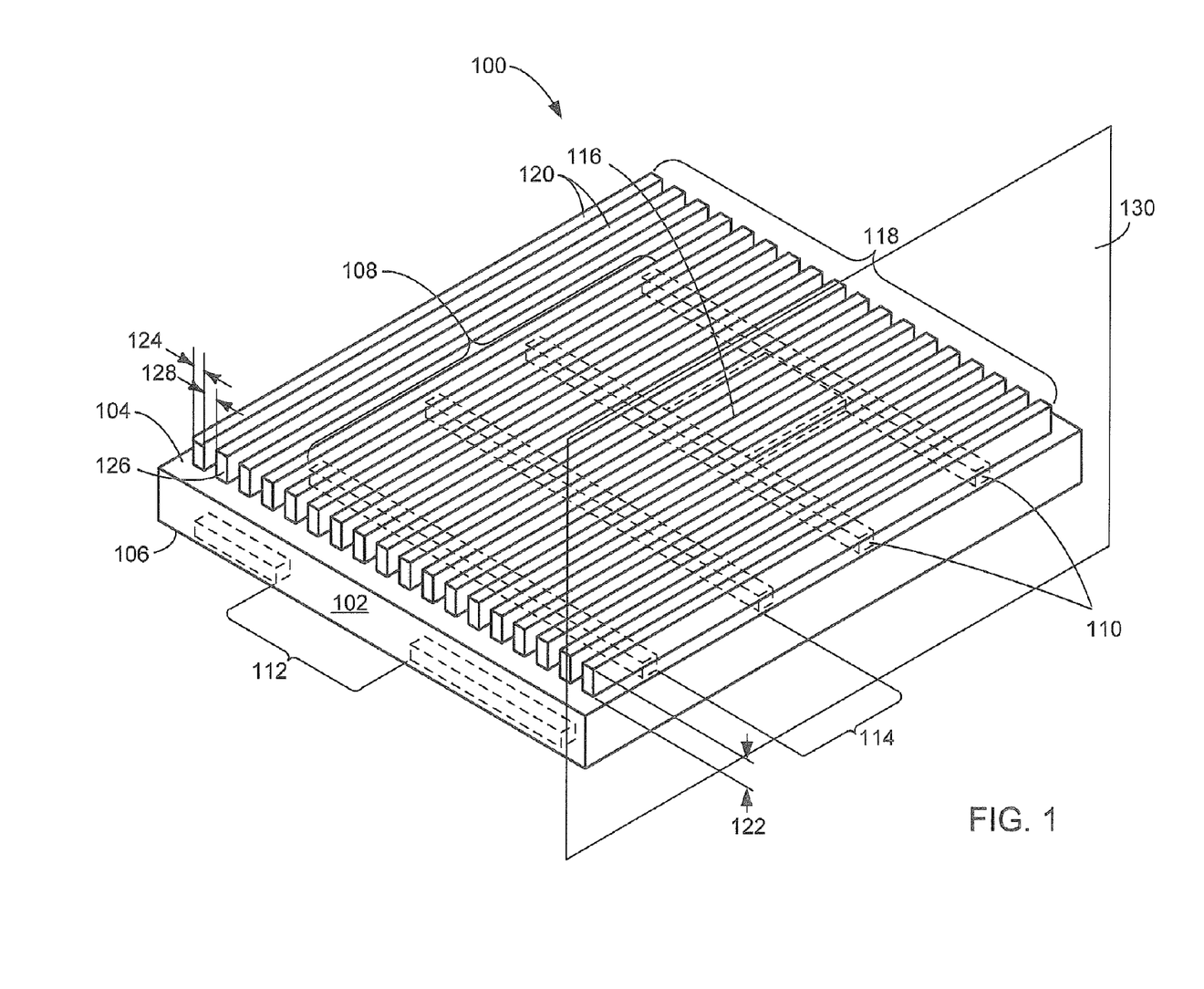
FIG. 1 is a cross-sectional isometric view of a polarizing photolithography reticle system in an embodiment of the present invention.
Figure 22:
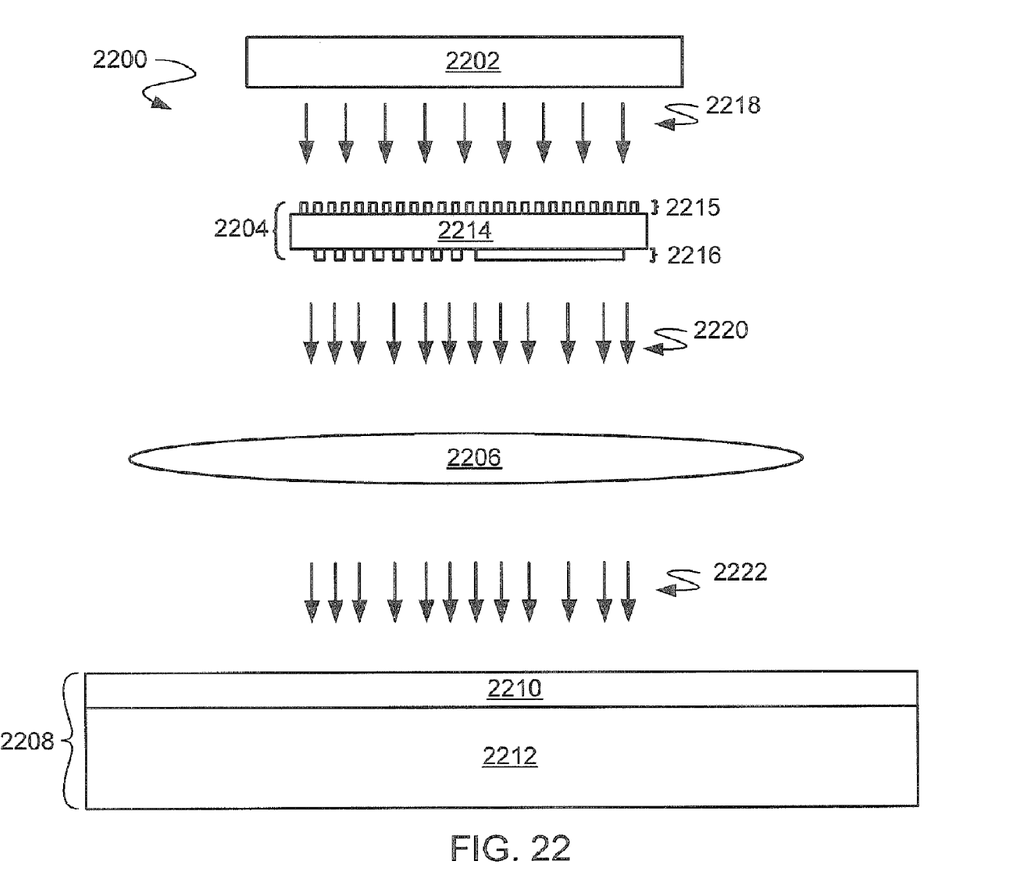
FIG. 22 is a cross-sectional view of the polarizing photolithography system in accordance with an embodiment of the present invention.

Referring now to FIG. 1, therein is shown a cross-sectional isometric view of a polarizing photolithography reticle system 100 in an embodiment of the present invention. The present invention is used to manufacture integrated circuits (not shown) in a polarizing photolithography system 2200 (FIG. 22) using a polarizing photolithographic projection system with patterns on the polarizing photolithography reticle system 100 imaged onto a semiconductor wafer 2212 (FIG. 22). The polarizing photolithography reticle system 100 includes a reticle substrate 102, such as quartz or silicon, with a polarizer side 104 and a circuit side 106. An orientation of the polarizing photolithography reticle system 100 places the polarizer side 104 toward an illumination source 2202 (FIG. 22) and the circuit side 106 toward the semiconductor wafer 2212.

The circuit side 106 includes first circuit patterns 108, such as patterns for active circuits, passive circuits, identification marks, or shielding, to be imaged onto the wafer. The first circuit patterns 108 include parallel horizontal first circuit lines 110, first intra-line spaces 112, first inter-line spaces 114, and first line interconnects 116 in any number of predetermined patterns. The first circuit lines 110, the first intra-line spaces 112, and the first inter-line spaces 114 provide the horizontal portions of the predetermined circuits (not shown) to be imaged onto the wafer for a step of the integrated circuit manufacturing process.

The vertical portions of the circuit pattern (not shown) may be imaged by rotating the polarizing photolithography reticle system 100 90° or by utilizing a different polarizing photolithography reticle system (not shown). The first line interconnects 116 may provide portions of the predetermined circuits or shielding for vertical portions of the predetermined circuits that may have been imaged onto the wafer an imaging step utilizing of the integrated circuit manufacturing process. The first circuit lines 110 and the first line interconnects 116 may be any number of materials, such as chrome or chromium based material.

The polarizer side 104 includes first polarization structures 118, such as wire lines, wire mesh, or wire grid. The first polarization structures 118 include parallel vertical first wires 120 with each having a first wire thickness 122, a first wire width 124, and a first wire shape 126. The first wires 120 may be any number of materials, such as chromium or chromium based material. Further, the first wires 120 in different embodiments can be of metals or non-metals. For example, a quartz (dielectric) grating, with another transparent coating material of significant reflectivity index, can produce the same polarization effect. The first wires 120 are perpendicular to the first circuit lines 110 such that the first circuit patterns 108 are perpendicular to the first polarization structures 118, wherein the first wires 120 are separated from each other by first wire spaces 128. A lithography system utilizes an illumination source (not shown) to image the first circuit patterns 108 from the polarizing photolithography reticle system 100 onto the wafer. The wavelength of the illumination and the properties of the first polarization structures 118 largely impact the polarization efficiency as well as the amount of transmission.

The illumination source 2202 emits an illumination having an electric field and a magnetic field. The illumination may have a polarization that is transverse electric (TE) with a plane of polarization in the same plane as a first length plane 130 of the first wires 120 but perpendicular to the plane of incidence. The illumination may also have a polarization that is transverse magnetic field (TM) with the plane of polarization in a plane perpendicular to the first length plane 130 but parallel to the plane of incidence.

The TE polarized light induces electric current in the vertical direction in the first wires 120 resulting in the forward transmitted radiation to be out of phase with the TE incident wave and results in reduced intensity. The first wire width 124 is very thin such that the TM incident wave causes negligible to no electric current in a horizontal direction in the first wires 120 resulting in most of the TM radiation to be transmitted.

The first wire thickness 122 also impacts the amount of electric current that may be generated in the first wires 120. As the first wire thickness 122 increases, the vertical electric current increases in the first wires 120 resulting in more TE radiation intensity reduction. Conversely, as the first wire thickness 122 increases, the horizontal electric current negligibly increases in the first wires 120 resulting in negligible loss in the TM radiation transmission.

The first wire shape 126 also impacts the transmission and polarization efficiency of the first polarization structures 118. Non-vertical sidewalls decrease the transmission without much effect on the polarization efficiency. Rounded edges decrease polarization efficiency and the transmission with larger decreases resulting from greater rounding. Rounded edges will also shift the peak transmission to shorter wavelengths. The first wire shape 126 with vertical sidewalls may balance transmission and polarization efficiencies.

The reticle substrate 102 provides an optical medium that is largely transparent to the illumination with negligible reflections. For illustrative purposes, the reticle substrate 102 is shown as a single contiguous material, although it is understood that the reticle substrate 102 may not be a single material or contiguous, as well. It is also understood that the reticle surface need not be planar on the polarizer side 104 or the circuit side 106 or both. Further, it is also understood the reticle substrate may be not solid, and may be a gelatinous substance or a fluid.

Figure 2:
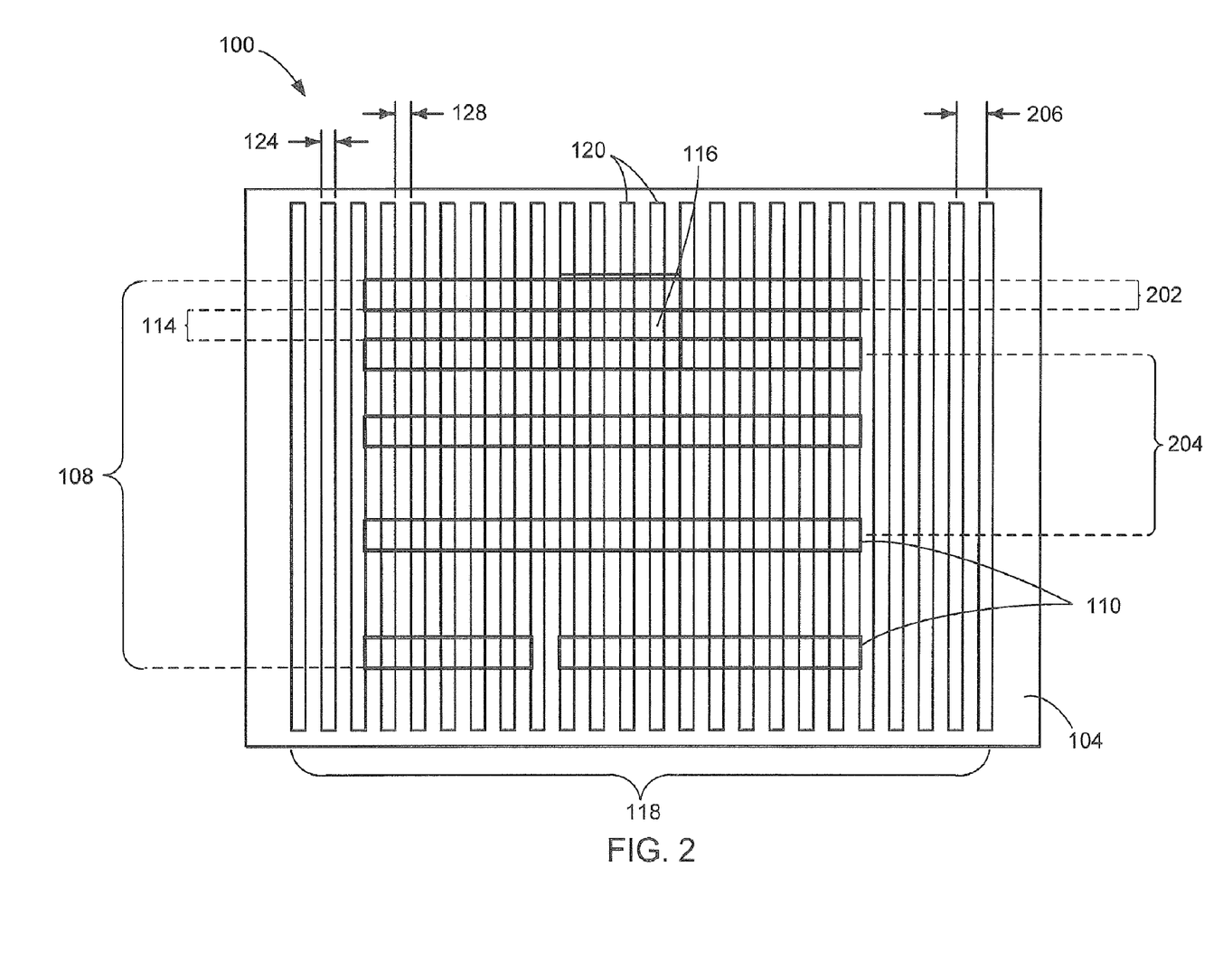
FIG. 2 is a top view of the polarizing photolithography reticle system of FIG. 1.

Referring now to FIG. 2, therein is shown a top view of the polarizing photolithography reticle system 100 of FIG. 1. The top view depicts the first circuit patterns 108 on the circuit side 106 shown in FIG. 1 with the first polarization structures 118 on the polarizer side 104. The first circuit lines 110 are perpendicular to the first wires 120.

On the circuit side 106, the first inter-line spaces 114 between the first circuit lines 110 are shown as four different space dimensions for a desired design. The first intra-line spaces 112, shown as a single instance, segment one instance of the first circuit lines 110. The first line interconnects 116, also shown as a single instance, may serve as part of the predetermined circuits to be imaged onto the wafer or as a shielding structure to protect vertical portions of the predetermined circuits that may have been imaged onto the wafer.

The properties of the first circuit patterns 108 impact different aspects of the lithography system. The first circuit lines 110 have first circuit width 202 that balance the reduction ratio requirement of the lithography system for a given integrated circuit technology node as well as avoid creating another polarizing structure on the circuit side 106. A first circuit period 204 is the distance between the centers of the first circuit lines 110 adjacent to each other and may be greater than half the illumination wavelength. Also, the first circuit period 204 may not be a constant value across the first circuit patterns 108 resulting from variations of the predetermined circuits. The first line interconnects 116 that connect or are between the first circuit lines 110 would make the first circuit patterns 108 an inefficient polarizer.

On the polarizer side 104, one of the most important properties of the first polarization structures 118 is a first polarizer period 206 of the first wires 120. The first polarizer period 206 is the distance between the centers of adjacent instances of the first wires 120 and determines the minimum illumination wavelength the first polarization structures 118 can polarize for a specific diffracted order. The first polarizer period 206 includes the first wire spaces 128 between adjacent instances of the first wires 120 as well as half of the first wire width 124 of the first wires 120 that are adjacent. Decreasing the first wire spaces 128 place the first wires 120 closer to each other resulting in an increased vertical electrical current and further reducing the TE radiation intensity. Decreasing the first wire width 124 of the first wires 120 attenuates the TM mode less and increases the TM radiation transmission resulting in an increased efficiency for the TM polarization. Decreasing the first wire spaces 128 or decreasing the first wire width 124 or combination of both decreases the first polarizer period 206.

Along with the first wire spaces 128 and the first wire width 124, the performance of the first polarization structures 118 is a function relating the first polarizer period 206 to the illumination wavelength. For a range of the first polarizer period 206 less than half the illumination wavelength, the first polarization structures 118 function as a zero order polarizer. For a range of the first polarizer period 206 between half to twice the illumination wavelength, the first polarization structures 118 function in a transition region with both polarization and diffraction properties. With some materials, the first polarization structures 118 in the transition region may have inverse polarization property. For a range of the first polarizer period 206 greater than twice the illumination wavelength, the first polarization structures 118 function more for diffraction and very little polarization.

With the first polarizer period 206 less than half the illumination wavelength, the first polarization structures 118 transmit majority of the incident TM radiation and largely provides TM polarization. The TM radiation transmission from the polarizer side 104 has a plane of polarization parallel to the first circuit lines 110 on the circuit side 106 resulting in an improved image contrast. The improved contrast alleviates one of the challenges utilizing high NA immersion lithography system.

To achieve the quality image of the horizontal portions of the predetermined circuits on the wafer, the polarizing photolithography reticle system 100 may be used with a dipole illumination in a Y-Dipole position. To achieve the quality image of the vertical portions of the predetermined circuits on the wafer, the polarizing photolithography reticle system 100 may be rotated 90° or a different polarizing photolithography reticle system (not shown) may be used for the vertical circuit lines (not shown) with the dipole illumination in a X-Dipole position.

Figure 3:
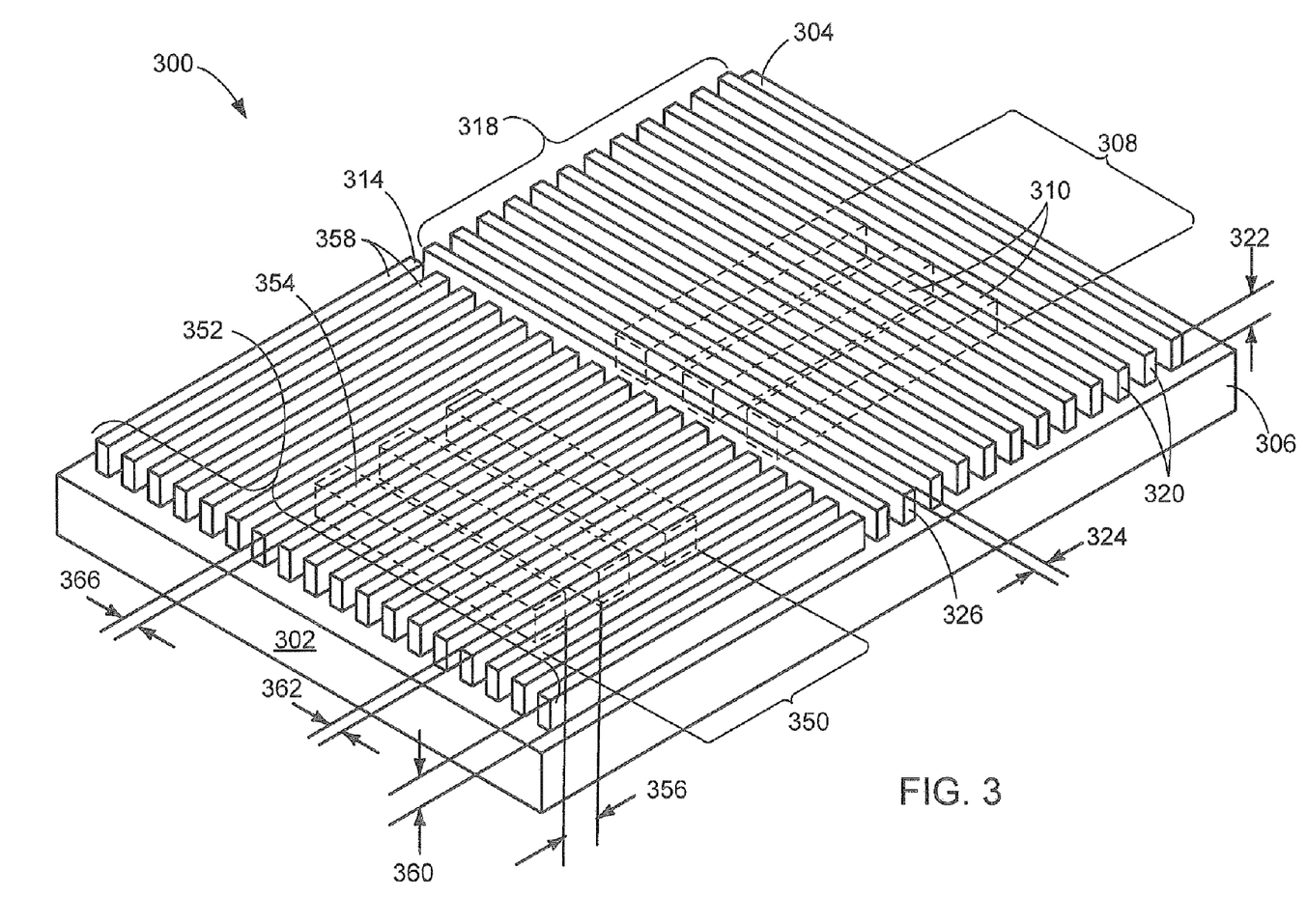
FIG. 3 is a cross-sectional isometric view of a polarizing photolithography reticle system in an alternative embodiment of the present invention.

Referring now to FIG. 3 therein is shown a cross-sectional isometric view of a polarizing photolithography reticle system 300 in an alternative embodiment of the present invention. Similar to the polarizing photolithography reticle system 100 of FIG. 1, the polarizing photolithography reticle system 300 includes a reticle substrate 302 having a polarizer side 304 and a circuit side 306. The circuit side 306 includes a first circuit patterns 308, wherein the first circuit patterns 308 include parallel horizontal first circuit lines 310, first intra-line spaces (not shown), and first inter-line spaces (not shown) in any number of predetermined patterns. The polarizer side 304 includes first polarization structures 318, wherein the first polarization structures 318 include parallel vertical first wires 320 with each having a first wire thickness 322, a first wire width 324, and a first wire shape 326.

In a similar construction to the polarizing photolithography reticle system 100 of FIG. 1, the polarizing photolithography reticle system 300 also includes second circuit patterns 350 on the circuit side 306 and second polarization structures 352 on the polarizer side 304 in an orientation orthogonal to the first circuit patterns 308 and the first polarization structures 318, respectively. The second circuit patterns 350 include parallel vertical second circuit lines 354, second intra-line spaces (not shown), and second inter-line spaces 356 in any number of predetermined patterns. The second polarization structures 352 include parallel horizontal second wires 358 with each having a second wire thickness 360, a second wire width 362, and a second wire shape 364. Second wire spaces 366 separates adjacent instances of the second wires 358.

Figure 4:
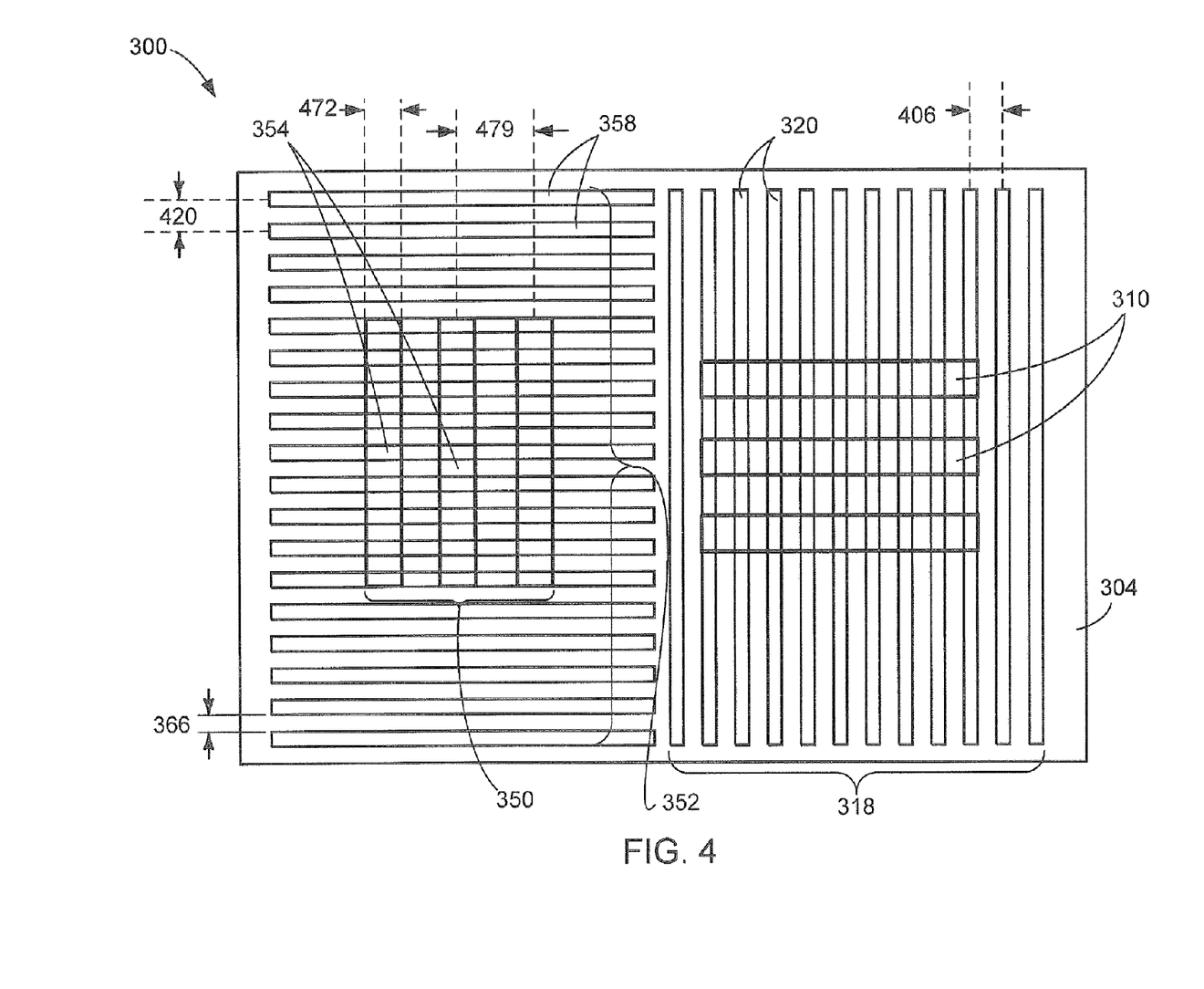
FIG. 4 is a top view of the polarizing photolithography reticle system of FIG. 3.

Referring now to FIG. 4 therein is shown a top view of the polarizing photolithography reticle system 300 of FIG. 3. Similarly, the top view depicts the first circuit patterns 308 having the first circuit lines 310 in a horizontal orientation on the circuit side 306 shown in FIG. 3 perpendicular to the first polarization structures 318 having the first wires 320 on the polarizer side 304. Also, the second circuit patterns 350 having the second circuit lines 354 in a vertical orientation on the circuit side 306 shown in FIG. 3 is depicted perpendicular to the second polarization structures 352 having the second wires 358 on the polarizer side 304. The polarizer side 304 also includes a first polarizer period 406 for the first wires 320 and a second period 470 for the second wires 358.

Similar to the first polarization structures 318, the second wires 358 of the second polarization structures 352 have a range for the second period 470 that may be less than half the illumination wavelength resulting in a plane of polarization vertical and parallel to the second circuit lines 354.

With illumination on the polarizing photolithography reticle system 300, the first circuit patterns 308 is imaged onto the wafer as the horizontal portions of the predetermined circuits for a step in the integrated circuit manufacturing process. Concurrently, the illumination also image onto the wafer the vertical portions of the predetermined circuits utilizing the second circuit patterns 350 during the same step of the integrated circuit manufacturing process. To create any corresponding orthogonal portions of the predetermined circuits, the polarizing photolithography reticle system 300 may be rotated 90° or a different polarizing photolithography reticle system (not shown) may be used to form the vertical circuit lines (not shown) corresponding to the first circuit lines 310 and the horizontal circuit lines (not shown) corresponding to the second circuit lines 354. However, to improve the image contrast on the wafer, the polarizing photolithography reticle system 300 may be illuminated in a double exposure, such as dipole illumination (not shown), or in a single exposure, such as cross-quadrupole (not shown) or annular illumination (not shown).

Similar to the properties of the first circuit patterns 108, the second circuit patterns 350 impact different aspects of the lithography system. The second circuit lines 354 each has a second circuit width 472 that balance the reduction ratio requirement of the lithography system for a given integrated circuit technology node as well as avoid creating another polarizing structure on the circuit side 306. Similarly, a second circuit period 474 is the distance between the centers of the second circuit lines 354 adjacent to each other. In order to avoid creating another polarizer on the circuit side 306, the second circuit period 474 is greater than half the illumination wavelength. Also, the second circuit period 474 may not be a constant value across the second circuit patterns 350 resulting from the variations of the predetermined circuits. The second line interconnects (not shown) that connects or are between the second circuit lines 354 would make the second circuit patterns 350 on the circuit side 306 shown in FIG. 3 an inefficient polarizer.

For illustrative purposes, the first polarization structures 318 and the second polarization structures 352 are depicted as perpendicular and next to each other on the polarizer side 304, although it is understood that the first polarization structures 318 and the second polarization structures 352 may not be perpendicular or next to each other. It is also understood that the induced electric current in the first wires 320 and the second wires 358 causes an antennae effect. Adequate design rules may be applied to shield or separate the first polarization structures 318 from the second polarization structure 352.

Figure 5:
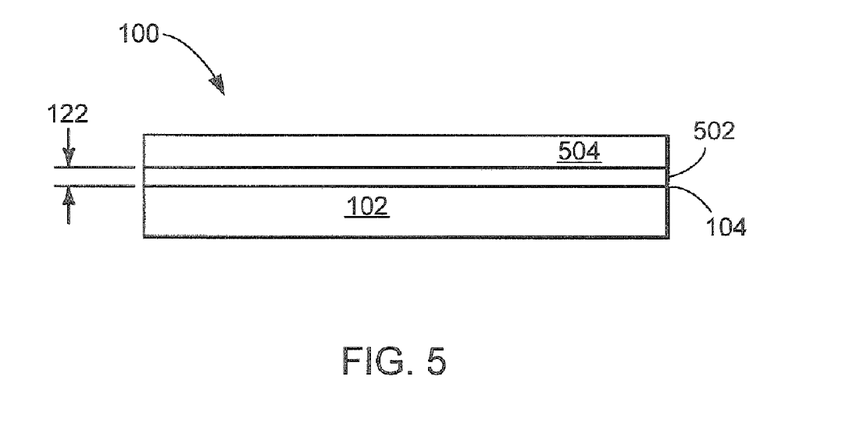
FIG. 5 is a cross-sectional view of the polarizing photolithography reticle system in a photomask blank phase.

Referring now to FIG. 5 therein is shown a cross-sectional view of the polarizing photolithography reticle system 100 in a photomask blank phase. During this phase, a wire layer 502, such as chrome or a chrome-based material, is coated on the polarizer side 104 of the reticle substrate 102. The thickness of the wire layer 502 is similar to the first wire thickness 122 of the first polarization structures 118 shown in FIG. 1. A resist layer 504 is applied on the wire layer 502. The wire layer 502 also serves as a bonding layer for the resist layer 504 to be attached over the reticle substrate 102.

For illustrative purposes, the wire layer 502 is shown as a single contiguous layer, although it is understood that it may not be, as well. The wire layer 502 may be stratified with different number of layers of same or different materials.

Figure 6:
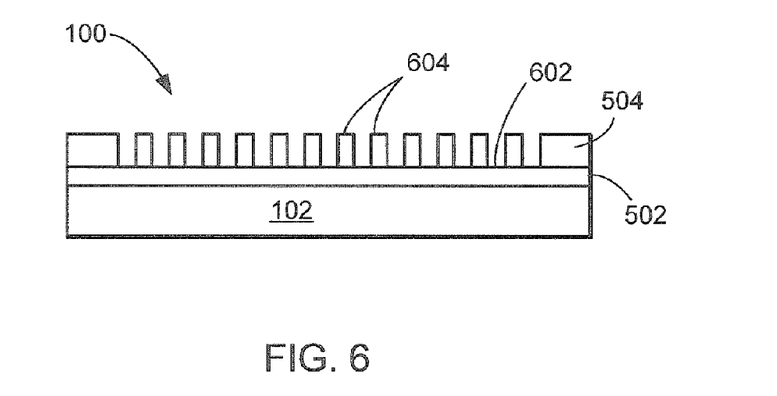
FIG. 6 is a cross-sectional view of the polarizing photolithography reticle system in a resist pattern phase.

Referring now to FIG. 6 therein is shown a cross-sectional view of the polarizing photolithography reticle system 100 in a resist pattern phase. During this phase, the resist layer 504 is patterned in any number of processes, such as with a laser or e-beam. The pattern on the resist layer 504 contains recesses 602 to form the first wire spaces 128 shown in FIG. 2 and resist strips 604 between the recesses 602 to form the first wire width 124 of the first wires 120 shown in FIG. 2. The width of the recesses 602 and the width of the resist strips 604 conform to the requirements of the predetermined first polarizer period 206 for the first wire spaces 128 shown in FIG. 2 and the first wire width 124 shown in FIG. 2, respectively.

Figure 7:
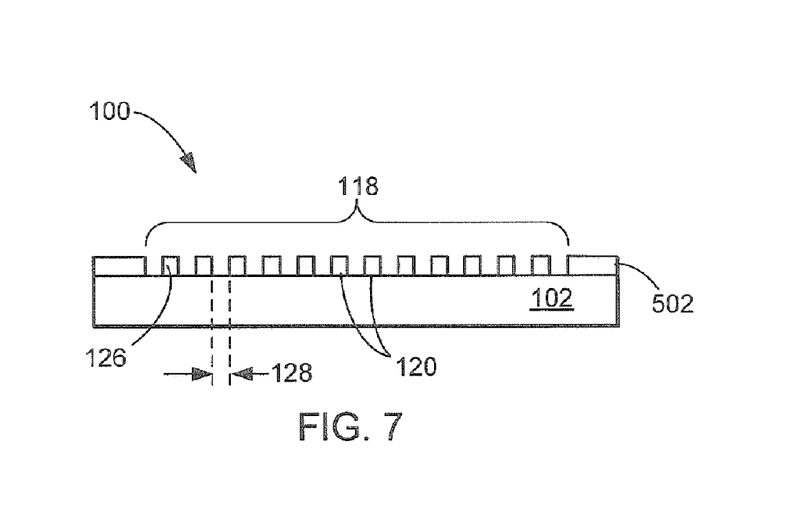
FIG. 7 is a cross-sectional view of the polarizing photolithography reticle system in a polarizer formation phase.

Referring now to FIG. 7 therein is shown a cross-sectional view of the polarizing photolithography reticle system 100 in a polarizer formation phase. During this phase, the wire layer 502 is etched exposing the reticle substrate 102. The etching process creates the first wire spaces 128 between the first wires 120 forming the first polarization structures 118. The resist layer 504 shown in FIG. 6 is removed and the first polarization structures 118 with the reticle substrate 102 are cleaned. The first wire shape 126 of the first wires 120 are shown with vertical sidewalls.

Figure 8:
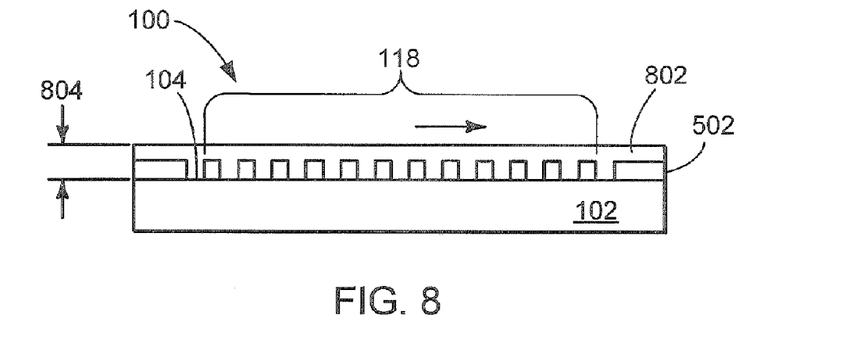
FIG. 8 is a cross-sectional view of the polarizing photolithography reticle system in a deposition phase of a transparent material.

Referring now to FIG. 8 therein is shown a cross-sectional view of the polarizing photolithography reticle system 100 in a deposition phase of a transparent material 802. This phase is optional. During this phase, the transparent material 802, such as SOG or $SiO_2$, is deposited over the polarizer side 104 and the first polarization structures 118 resulting in a transparent material layer 804. The transparent material layer 804 protects the polarizer side 104 during further processing, shipping, and use in integrated circuit manufacturing. The transparent material 802 include any number of properties, such as optical transparency or negligible optical reflection.

Figure 9:
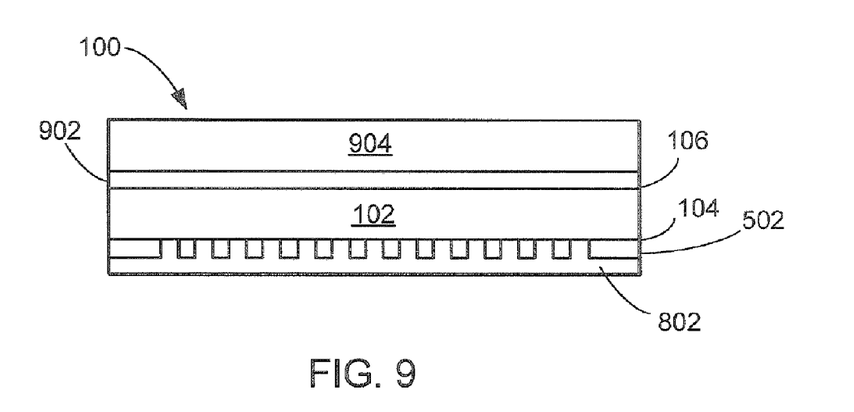
FIG. 9 is a cross-sectional view of the polarizing photolithography reticle system in a reverse mask phase.

Referring now to FIG. 9 therein is shown a cross-sectional view of the polarizing photolithography reticle system 100 in a reverse mask phase. During this phase, processing occurs on the circuit side 106. A circuit pattern layer 902, such as chrome or chrome-based material, is coated on the reticle substrate 102. A reverse resist layer 904 is applied on the circuit pattern layer 902.

For illustrative purposes, the circuit pattern layer 902 is shown as a single contiguous layer, although it is understood that it may not be, as well. The circuit pattern layer 902 may be stratified with different number of layers of same or different materials.

Figure 10:
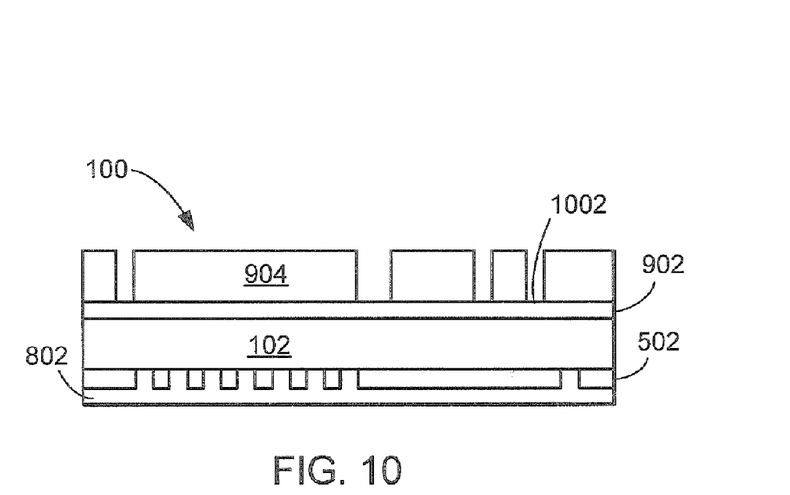
FIG. 10 is a cross-sectional view of the polarizing photolithography reticle system in a reverse resist pattern phase.

Referring now to FIG. 10 therein is shown a cross-sectional view of the polarizing photolithography reticle system 100 in a reverse resist pattern phase. During this phase, the reverse resist layer 904 is patterned in any number of processes, such as with a laser or e-beam. The pattern on the reverse resist layer 904 contains reverse recesses 1002 to form the first inter-line spaces 114 shown in FIG. 1, the first intra-line spaces 112 shown in FIG. 1, and regions without the first circuit lines 110 shown in FIG. 1 or without the first line interconnects 116 shown in FIG. 1. The remaining portions of the reverse resist layer 904 between the reverse recesses 1002 provide patterns for the first circuit lines 110 shown in FIG. 1 and the first line interconnects 116 shown in FIG. 1. The dimensions of the first inter-line spaces 114 shown in FIG. 1 and the first circuit lines 110 shown in FIG. 1 conform to the requirements of the predetermined first circuit period 204 shown in FIG. 2.

Figure 11:
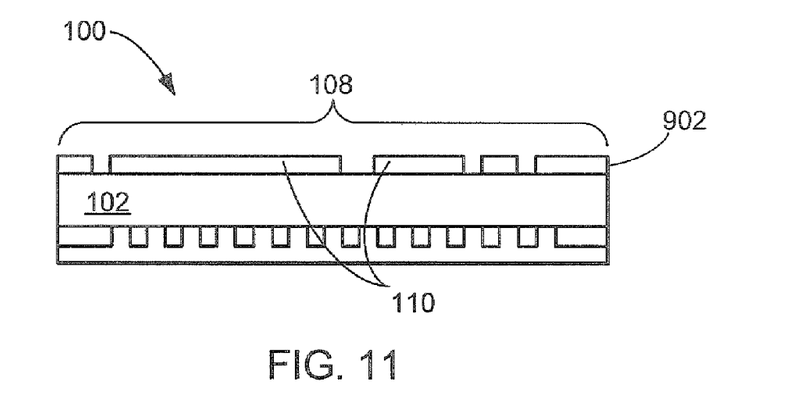
FIG. 11 is a cross-sectional view of the polarizing photolithography reticle system in a formation phase of the first circuit patterns.

Referring now to FIG. 11 therein is shown a cross-sectional view of the polarizing photolithography reticle system 100 in a formation phase of the first circuit patterns 108. During this phase, the circuit pattern layer 902 is etched exposing the reticle substrate 102. The etching process creates the first circuit lines 110 and the first line interconnects 116 shown in FIG. 2. The reverse resist layer 904 shown in FIG. 10 is removed and the first circuit patterns 108 with the reticle substrate 102 are cleaned.

Figure 12:
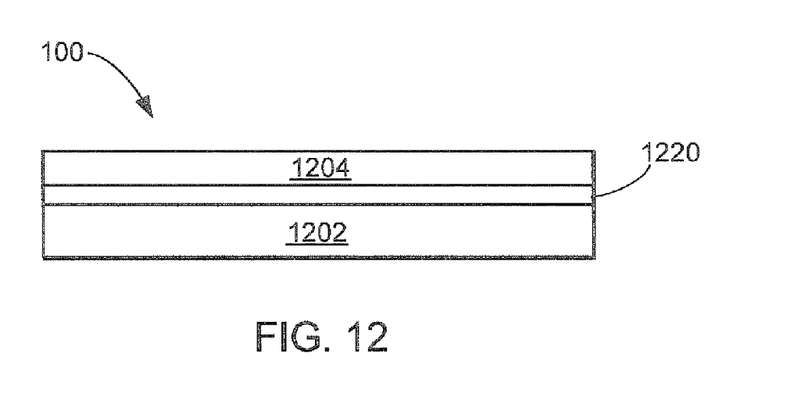
FIG. 12 is a cross-sectional view of the polarizing photolithography reticle system in an alternative photomask blank phase.

Referring now to FIG. 12 therein is shown a cross-sectional view of the polarizing photolithography reticle system 100 in an alternative photomask blank phase. This alternative phase is similar to the photomask blank phase of FIG. 5. The polarizer side 104 of the reticle substrate 1202 is coated with an attachment layer 1220, such as chrome or chrome based material. The attachment layer 1220 allows the resist layer 1204 to be applied over the reticle substrate 1202 and on the attachment layer 1220.

For illustrative purposes, the attachment layer 1220 is shown as a single contiguous layer, although it is understood that it may not be, as well. The attachment layer 1220 may be stratified with different number of layers of same or different materials.

Figure 13:
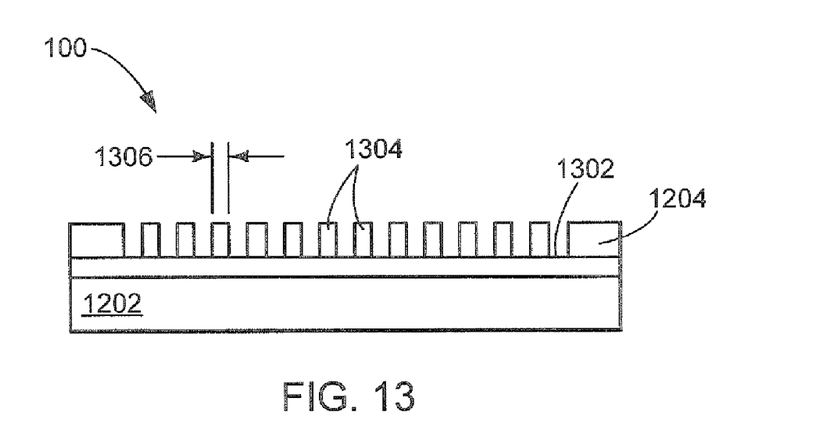
FIG. 13 is a cross-sectional view of the polarizing photolithography reticle system in an alternative resist pattern phase.

Referring now to FIG. 13 therein is shown a cross-sectional view of the polarizing photolithography reticle system 100 in an alternative resist pattern phase. This alternative phase is similar to the resist pattern phase of FIG. 6. During this phase, the resist layer 1204 is patterned in any number of processes, such as with a laser or e-beam. The pattern on the resist layer 1204 contains recesses 1302 to form the first wires 120 shown in FIG. 2 and resist strips 1304 between the recesses 1302 to form third wire spaces 1306. The dimensions of the recesses 1302 and the width of the resist strips 1304 conforms to the requirements of the predetermined first polarizer period 206 shown in FIG. 2 for the first wires 120 shown in FIG. 1 and the third wire spaces 1306, respectively.

Figure 14:
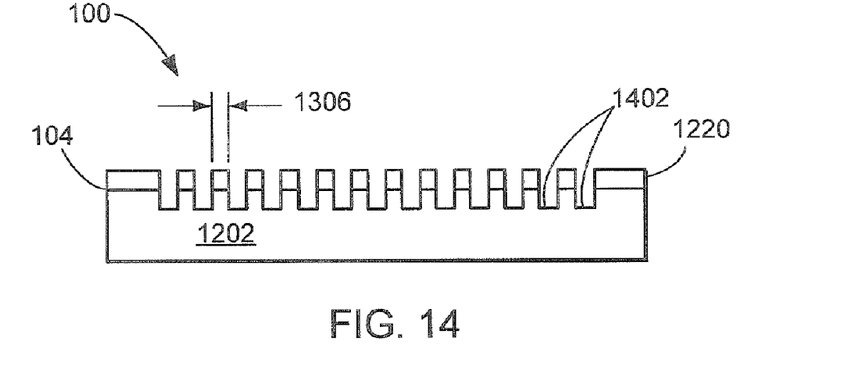
FIG. 14 is a cross-sectional view of the polarizing photolithography reticle system in an etch phase.

Referring now to FIG. 14 therein is shown a cross-sectional view of the polarizing photolithography reticle system 100 in an etch phase. During this phase, the attachment layer 1220 is etched as well as portions of the reticle substrate 1202 to create reticle substrate recesses 1402. The etching process creates the third wire spaces 1306 between the reticle substrate recesses 1402. The resist layer 1204 shown in FIG. 13 is removed and the polarizer side 104 with the attachment layer 1220, etched, is cleaned.

Figure 15:
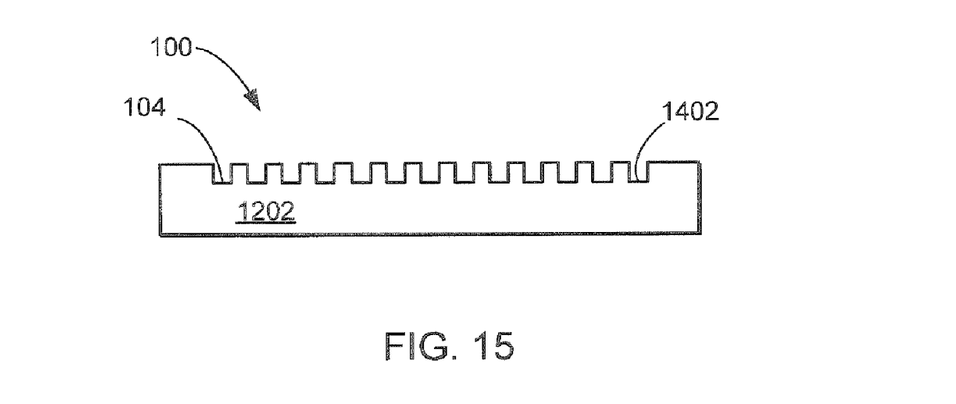
FIG. 15 is a cross-sectional view of the polarizing photolithography reticle system in a removal phase of an attachment layer.

Referring now to FIG. 15 therein is shown a cross-sectional view of the polarizing photolithography reticle system 100 in a removal phase of the attachment layer 1220. During this phase, the attachment layer 1220 shown in FIG. 11 is removed resulting in the reticle substrate with reticle substrate recesses 1402 on the polarizer side 104.

Figure 16:
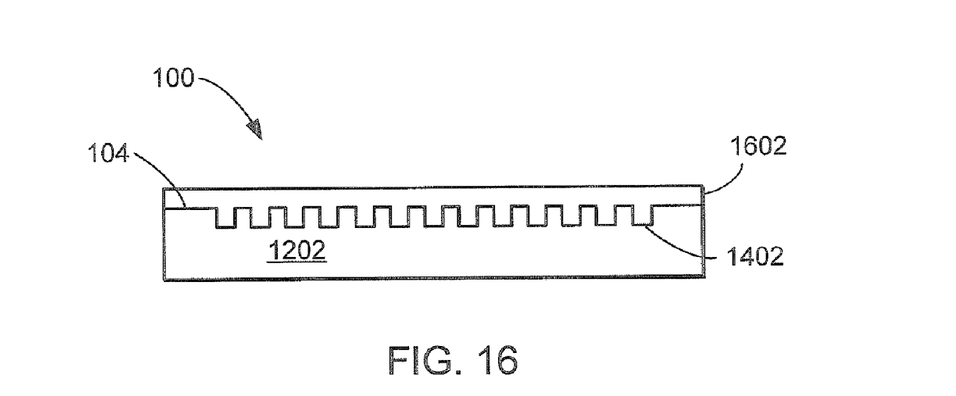
FIG. 16 is a cross-sectional view of the polarizing photolithography reticle system in a polarizer material deposition phase.

Referring now to FIG. 16 therein is shown a cross-sectional view of the polarizing photolithography reticle system 100 in a polarizer material deposition phase. During this phase, a wire layer 1602, such as chrome or chrome based material, is deposited on the polarizer side 104 and fills the reticle substrate recesses 1402. For illustrative purposes, the wire layer 1602 is shown as a single contiguous layer, although it is understood that it may not be, as well. The wire layer 1602 may be stratified with different number of layers of same or different materials.

Figure 17:
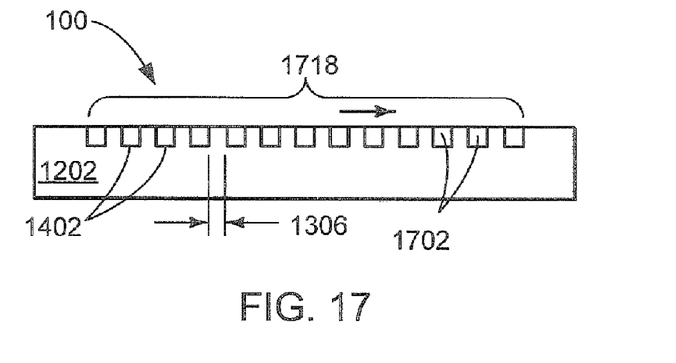
FIG. 17 is a cross-sectional view of the polarizing photolithography reticle system in a polarizer material planarization phase.

Referring now to FIG. 17 therein is shown a cross-sectional view of the polarizing photolithography reticle system 100 in a polarizer material planarization phase. During this phase, the wire layer 1602 shown in FIG. 16 is removed and planarized exposing the reticle substrate 1202 and the reticle substrate recesses 1402 filled with the materials of the wire layer 1602 forming third wires 1702. The removal and planarization process may be any number of processes, such as etch or chemical mechanical polish (CMP). Third polarization structures 1718 are formed with the material of the reticle substrate 1202 as the third wire spaces 1306.

Figure 18:
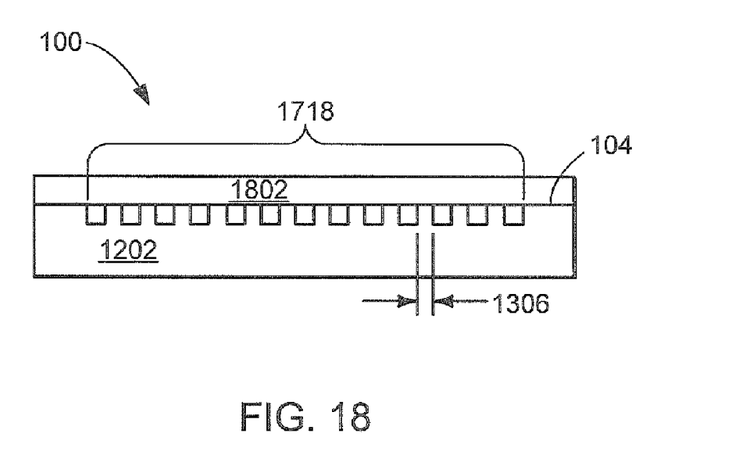
FIG. 18 is a cross-sectional view of the polarizing photolithography reticle system in an alternative deposition phase of a transparent material.

Referring now to FIG. 18 therein is shown a cross-sectional view of the polarizing photolithography reticle system 100 in an alternative deposition phase of a transparent material 1802. This phase is similar to the deposition phase of the transparent material 802 of FIG. 8. This phase is optional. During this phase, the transparent material 1802, such as SOG or SiO$_2$, is deposited over the polarizer side 104 and third polarization structures 1718. The transparent material 1802 protects the polarizer side 104 during further processing, shipping, and integrated circuit manufacturing. The third polarization structures 1718 have the third wire spaces 1306. The third wire spaces 1306 comprise the material of the reticle substrate 1202. The first wire spaces 128 shown in FIG. 2 and the second wire spaces 366 shown in FIG. 4 comprise of the transparent material 802 shown in FIG. 8.

Figure 19:
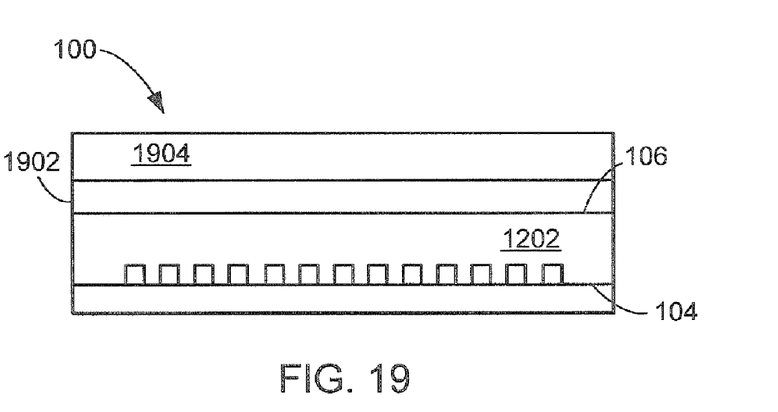
FIG. 19 is a cross-sectional view of the polarizing photolithography reticle system in an alternative reverse mask phase.

Referring now to FIG. 19 therein is shown a cross-sectional view of the polarizing photolithography reticle system 100 in an alternative reverse mask phase. This phase is similar to the reverse mask phase of FIG. 9. During this phase, processing occurs on the circuit side 106. A circuit pattern layer 1902, such as chrome or chrome based material, is coated on the reticle substrate 1202. A reverse resist layer 1904 is applied on the circuit pattern layer 1902.

Figure 20:
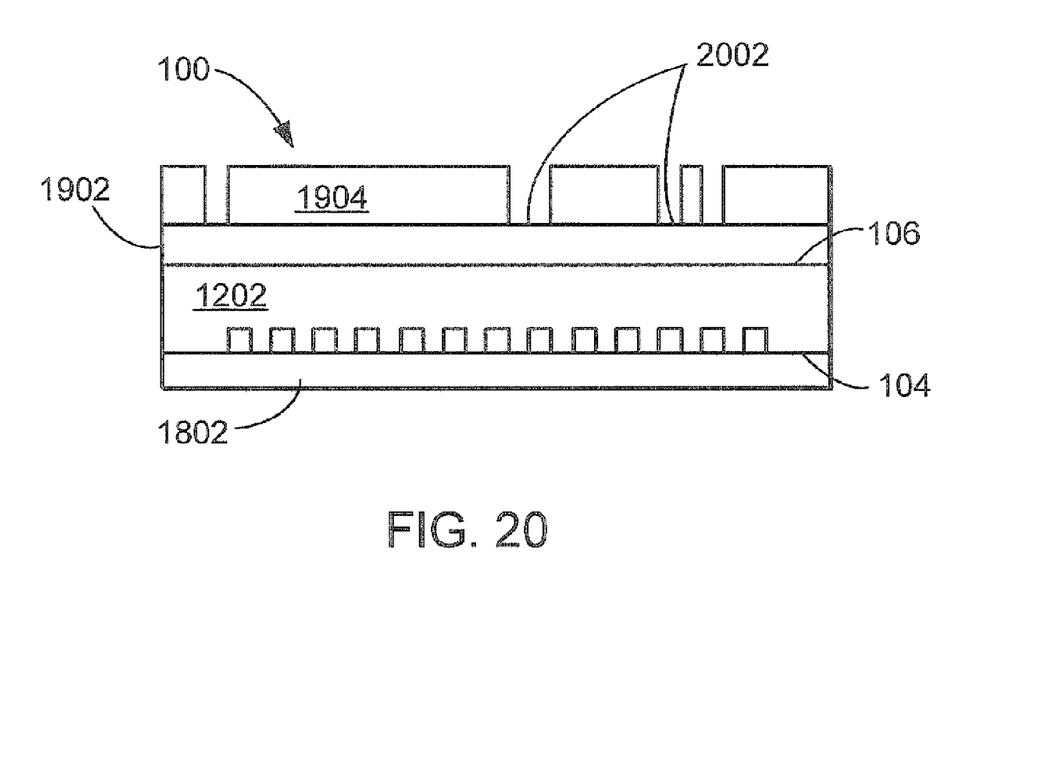
FIG. 20 is a cross-sectional view of the polarizing photolithography reticle system in an alternative reverse resist pattern phase.

Referring now to FIG. 20 therein is shown a cross-sectional view of the polarizing photolithography reticle system 100 in an alternative reverse resist pattern phase. This phase is similar to the reverse resist pattern phase of FIG. 10. During this phase, the reverse resist layer 1904 is patterned in any number of processes, such as with a laser or e-beam. The pattern on the reverse resist layer 1904 contains reverse recesses 2002 to form the first inter-line spaces 114 shown in FIG. 1, the first intra-line spaces 112 shown in FIG. 1, and regions without first circuit lines 110 shown in FIG. 1 or first line interconnects 116 shown in FIG. 1. The reverse resist layer 1904 provides patterns for the first circuit lines 110 shown in FIG. 1 and the first line interconnects 116 shown in FIG. 1. The dimensions of the first inter-line spaces 114 shown in FIG. 1 and the first intra-line spaces 112 shown in FIG. 1 conforms to the requirements of the predetermined first circuit period 204 shown in FIG. 2.

Figure 21:
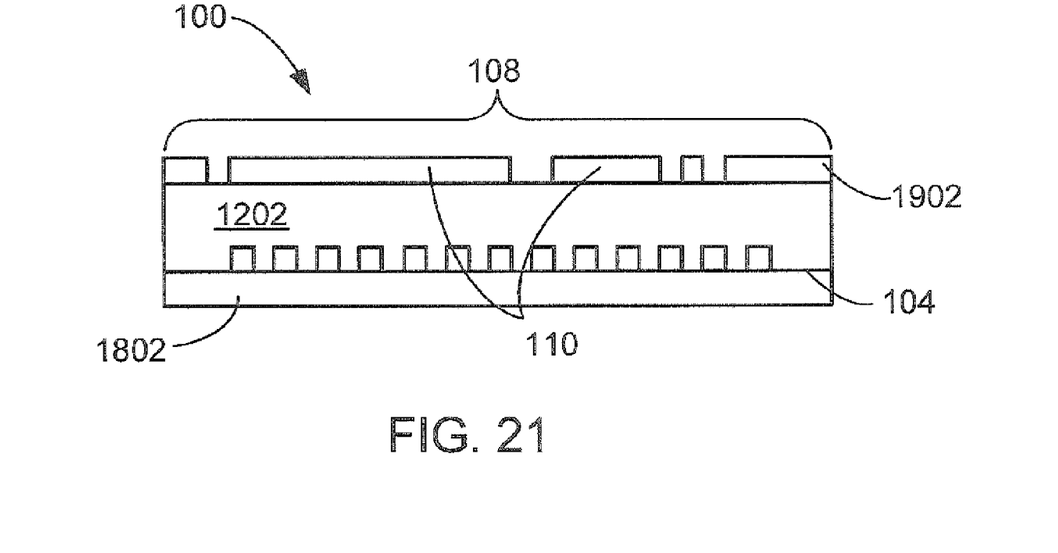
FIG. 21 is a cross-sectional view of the polarizing photolithography reticle system in an alternative formation phase of the first circuit pattern patterns.

Referring now to FIG. 21 therein is shown a cross-sectional view of the polarizing photolithography reticle system 100 in an alternative formation phase of the first circuit patterns 108. This phase is similar to the formation phase of the first circuit patterns 108 of FIG. 11. During this phase, the circuit pattern layer 1902 is etched exposing the reticle substrate 1202. The etching process creates the first circuit lines 110 and the first line interconnects 116 shown in FIG. 2. The reverse resist layer 1904 shown in FIG. 20 is removed and the first circuit patterns 108 with the reticle substrate 1202 are cleaned.

Referring now to FIG. 22, therein is shown a simplified schematic of the polarizing photolithographic system 2200 using the present invention. In the polarizing photolithographic system 2200, radiation is directed from the illumination source 2202 through a polarizing photolithography reticle system 2204 and a lens 2206 onto a coated semiconductor wafer 2208.

The coated semiconductor wafer 2208 includes a photoresist layer 2210 on the semiconductor substrate 2212, which will form numerous integrated circuits when completed.

The polarizing photolithography reticle system 2204 includes a light-transparent substrate 2214, of a material such as fused silica or quartz, with polarization structures 2215 and circuit patterns 2216.

The present system is applicable to any wavelength of radiation and the modifications for other wavelengths would be obvious to those skilled in the art based on the description of the present invention provided herein.

The illumination source 2202 produces light 2218, which the polarizing photolithography reticle system 2204 selectively allows through as patterned light 2220 to be focused by the lens 2206 on to selected areas of the photoresist layer 2210 to reproduce the pattern of the polarizing photolithography reticle system 2204.

Figure 23:
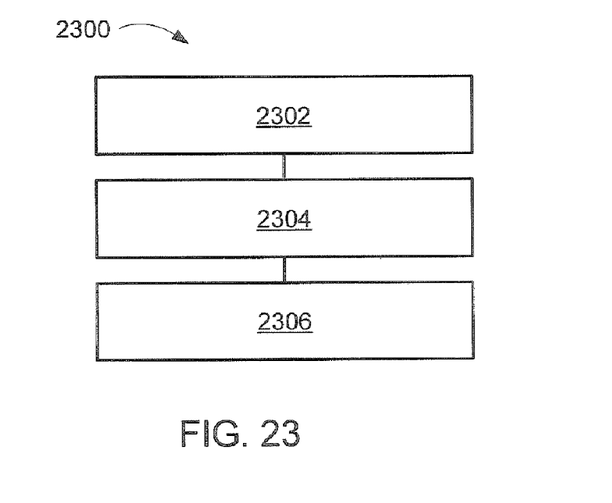
FIG. 23 therein is shown a flow chart of a system in an embodiment of the present invention.

Referring now to FIG. 23 therein is shown a flow chart of a polarizing photolithography system 2300 for fabricating a polarizing photolithography reticle system 2204 in an embodiment of the present invention. The system 2300 includes providing a reticle substrate in a block 2302; forming polarization structures on the reticle substrate in a block 2304; and etching circuit patterns on the reticle substrate on a side opposite the polarization structures in a block 2306.

It has been discovered that the present invention thus has numerous aspects.

It has been discovered that a polarizing mask blank can be manufactured with fine wire mesh on the surface of the mask opposite to the chrome and resist coating, to produce the desired polarization for the application of dual dipole lithography (DDL). It has been shown that DDL can greatly increase the resolution and process windows but with the use of polarized light, the image contrast can be improved. Thus greater process margin can be obtained.

Another aspect is that the fine wire mesh could be used to generate the required TE or TM polarization with both horizontal and vertical polarization structures on the reticle substrate. Single exposure illumination can be achieved with self-polarized light using this invention, such as cross-quadrupole or annular illumination. Single exposure can be performed using high NA with polarization light enhancement with the use of high NA system.

Another aspect is that the present invention is providing polarization of the illuminating light source is needed with the high NA used in immersion lithography systems. The fine wire mesh on the mask surface allows for incremental capital investment and re-use of proven existing equipment to achieve new integrated circuit technology nodes. These incremental investments may provide sufficient longevity to 35 nm node.

Yet another aspect is that the present invention mitigates the polarization effects of the circuit patterns on the circuit side of the reticle substrate resulting improved reticle modeling and yields. This also results in improved integrated circuits yield leading to reduced cost.

Thus, it has been discovered that the polarizing photolithography reticle of the present invention furnish important and heretofore unknown and unavailable solutions, capabilities, and functional aspects for developing new integrated circuits technology nodes while making the re-using proven existing equipments and incrementally invest in evolutionary changes. The resulting processes and configurations are straightforward, cost-effective, uncomplicated, highly versatile and effective, can be implemented by adapting known technologies, and are thus readily suited for efficiently and economically manufacturing integrated circuit devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A polarizing photolithography system comprising:
providing a reticle substrate;
forming polarization structures on the reticle substrate; and
etching circuit patterns, perpendicular to the polarization structures, on the reticle substrate on a side opposite the polarization structures.

2. The system as claimed in claim 1 wherein forming the polarization structures on the reticle substrate comprise forming wires in a perpendicular orientation to the circuit patterns.

3. The system as claimed in claim 1 wherein forming the polarization structures on the reticle substrate comprise forming wires parallel to each other.

4. The system as claimed in claim 1 wherein forming the polarization structures on the reticle substrate comprise forming wires spaced less than a half of an illumination wavelength.

5. The system as claimed in claim 1 wherein etching the circuit patterns comprise etching circuit lines parallel to each other.

6. A polarizing photolithography system comprising:
providing a reticle substrate having a polarizer side and a circuit side;
coating a wire layer on the polarizer side;
coating a resist layer on the wire layer;
forming recesses in the resist layer;
etching first wires parallel to each other from the wire layer between the recesses;
coating a circuit pattern layer on the circuit side;
coating a reverse resist layer on the circuit pattern layer;
forming reverse recesses in the reverse resist layer; and
etching first circuit patterns in a perpendicular orientation to the first wires from the circuit pattern layer between the reverse recesses.

7. The system as claimed in claim 6 further comprising:
forming second wires parallel to each other on the polarizer side perpendicular to the first wires; and
forming second circuit patterns perpendicular to the first circuit patterns.

8. The system as claimed in claim 6 wherein etching the first circuit patterns comprise forming first line interconnects for shielding vertical portions of predetermined circuits imaged on the wafer.

9. The system as claimed in claim 6 further comprising placing an orientation having the polarizer side toward the illumination source and the circuit side toward the wafer.

10. The system as claimed in claim 6 further comprising forming third wires parallel to each other in the reticle substrate exposed on the polarizer side.

11. A polarizing photolithography system comprising:
a reticle substrate;
polarization structures on the reticle substrate; and
circuit patterns, perpendicular to the polarization structures, on the reticle substrate on a side opposite the polarization structures.

12. The system as claimed in claim 11 wherein the polarization structures on the reticle substrate comprise wires in a perpendicular orientation to the circuit patterns.

13. The system as claimed in claim 11 wherein the polarization structures on the reticle substrate comprise wires parallel to each other.

14. The system as claimed in claim 11 wherein the polarization structures on the reticle substrate comprise wires spaced less than a half of an illumination wavelength.

15. The system as claimed in claim 11 wherein the circuit patterns comprise circuit lines parallel to each other.

16. The system as claimed in claim 11 wherein:
the reticle substrate has a polarizer side and a circuit side;
a wire layer on the polarizer side;
first wires parallel to each other from the wire layer;
a circuit pattern layer on the circuit side; and
the circuit patterns include first circuit patterns in a perpendicular orientation to the first wires from the circuit pattern layer.

17. The system as claimed in claim 16 further comprising:
second wires parallel to each other on the polarizer side perpendicular to the first wires; and
second circuit patterns perpendicular to the first circuit patterns.

18. The system as claimed in claim 16 wherein the first circuit patterns comprise first line interconnects for shielding vertical portions of predetermined circuits imaged on the wafer.

19. The system as claimed in claim 16 further comprising an orientation having the polarizer side toward the illumination source and the circuit side toward the wafer.

20. The system as claimed in claim 16 further comprising third wires parallel to each other in the reticle substrate exposed on the polarizer side.

* * * * *